United States Patent
Ichioka et al.

(10) Patent No.: US 10,438,679 B2
(45) Date of Patent: Oct. 8, 2019

(54) MEMORY DIAGNOSIS APPARATUS AND MEMORY DIAGNOSIS PROGRAM

(71) Applicant: Mitsubishi Electric Corporation, Tokyo (JP)

(72) Inventors: Ryoya Ichioka, Tokyo (JP); Ryoichi Sasaki, Tokyo (JP); Takahiro Akimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 108 days.

(21) Appl. No.: 15/554,751

(22) PCT Filed: Mar. 10, 2015

(86) PCT No.: PCT/JP2015/057050
§ 371 (c)(1),
(2) Date: Aug. 31, 2017

(87) PCT Pub. No.: WO2016/143077
PCT Pub. Date: Sep. 15, 2016

(65) Prior Publication Data
US 2018/0240532 A1    Aug. 23, 2018

(51) Int. Cl.
*G11C 29/38*     (2006.01)
*G06F 12/16*    (2006.01)
(Continued)

(52) U.S. Cl.
CPC .............. *G11C 29/38* (2013.01); *G06F 12/16* (2013.01); *G11C 29/06* (2013.01); *G11C 29/16* (2013.01);
(Continued)

(58) Field of Classification Search
CPC ......... G11C 29/38; G11C 29/16; G11C 29/06; G11C 2029/4402; G11C 29/36; G06F 12/16
See application file for complete search history.

(56) References Cited

U.S. PATENT DOCUMENTS 5,937,367 A    8/1999 Eckardt
2009/0089631 A1    4/2009 Kanamaru et al.
(Continued)

FOREIGN PATENT DOCUMENTS

JP    10-154105 A    6/1998
JP    2011-028657 A    2/2011
(Continued)

OTHER PUBLICATIONS

Ravindra Nair et al., "Efficient Algorithms for Testing Semiconductor Random-Access Memories," IEEE Transactions on Computers, Jun. 1978, pp. 572-576, vol. c-27, No. 6.
(Continued)

*Primary Examiner* — Thien Nguyen
(74) *Attorney, Agent, or Firm* — Sughrue Mion, PLLC; Richard C. Turner (57) ABSTRACT

A memory diagnosis apparatus to diagnose whether a fault occurs in a memory includes a diagnosis execution unit to divide the memory into a plurality of areas, select two or more base areas that are diagnostic targets from among the areas to carry out a memory diagnosis including a reading test and a writing test, and perform only the writing test in carrying out the memory diagnosis on a same base area for second or more times. The diagnosis execution unit is implemented by an arithmetic device that is a processing circuit that executes a memory diagnosis program stored in a storage device.

7 Claims, 5 Drawing Sheets

(51) Int. Cl.
  *G11C 29/06* (2006.01)
  *G11C 29/16* (2006.01)
  *G11C 29/36* (2006.01)
  *G11C 29/44* (2006.01)

(52) U.S. Cl.
  CPC ...... *G11C 29/36* (2013.01); *G11C 2029/4402* (2013.01)

(56) References Cited

U.S. PATENT DOCUMENTS

2013/0238947 A1* 9/2013 Ichioka .................. G11C 29/56
                                                                714/718
2014/0095949 A1    4/2014 Nakatani et al.

FOREIGN PATENT DOCUMENTS

| JP | 2014-071770 A | 4/2014 |
| WO | 2007/055068 A1 | 5/2007 |
| WO | 2012/111135 A1 | 8/2012 |

OTHER PUBLICATIONS

Decision to Grant a Patent issued in Japanese Patent Application No. 2016-554513 dated Oct. 11, 2016.
International Search Report of PCT/JP2015/057050 dated May 26, 2015.

* cited by examiner

MEMORY DIAGNOSIS APPARATUS AND MEMORY DIAGNOSIS PROGRAM

CROSS REFERENCE TO RELATED APPLICATIONS

This application is a National Stage of International Application No. PCT/JP2015/057050 filed Mar. 10, 2015, the contents of which are incorporated herein by reference in its entirety.

FIELD

The present invention relates to a memory diagnosis apparatus and a memory diagnosis program that detect a memory fault.

BACKGROUND

As disclosed in Patent Literature 1, there has been a conventionally-known technique to divide the memory to be diagnosed into a plurality of areas, and perform a combination of two types of commonly-known memory diagnoses on a combination of the divided areas to thereby detect a memory fault.

It is common that a diagnosis on a memory applied to a safety device is required to detect two types of faults referred to as "coupling fault" and "stuck-at fault". The coupling fault is a fault in which the value of a certain cell within the memory causes an unwanted change in the value of another cell. The stuck-at fault is a fault in which the value of a certain cell within the memory is fixed at 0 or 1, and cannot be changed.

The necessary procedure to detect a coupling fault and a stuck-at fault has been disclosed in Non Patent Literature 1.

CITATION LIST

Patent Literature

Patent Literature 1: Japanese Patent Application Laid-open No. H10-154105

Non Patent Literature

Non Patent Literature 1: RAVINDRA NAIR, SATISH. M. THATTE, AND JACOB A. ABRAHAM: Efficient Algorithms for Testing Semiconductor Random-Access Memories. IEEE TRANSACTIONS ON COMPUTERS, VOL. c-27, No. 6, JUNE 1978 pp. 572-576

SUMMARY

Technical Problem

However, the invention disclosed in Patent Literature 1 listed above carries out a fault diagnosis by dividing the memory into a plurality of areas, and performing the same process on each combination of the areas. This means that an omissible part of the procedure in detecting a memory fault is repeatedly performed, which poses a problem of a longer processing time.

The present invention has been achieved in view of the above problems, and an object of the present invention is to provide a memory diagnosis apparatus that reduces the processing time required for a memory diagnosis without decreasing the diagnostic rate.

Solution to Problem

To solve the problem and achieve the object, the present invention provides a memory diagnosis apparatus to diagnose whether a fault occurs in a memory, the memory diagnosis apparatus comprising a diagnosis execution unit to divide the memory into a plurality of areas, select two or more base areas as diagnostic targets from among the areas to carry out a memory diagnosis including a reading test and a writing test, and perform only the writing test in carrying out a memory diagnosis on a same base area for second or more times.

Advantageous Effects of Invention

The memory diagnosis apparatus of the present invention achieves an effect of reducing the processing time required for the memory diagnosis without decreasing the diagnostic rate.

DESCRIPTION OF EMBODIMENT

An exemplary embodiment of a memory diagnosis apparatus and a memory diagnosis program according to the present invention will be described below in detail with reference to the accompanying drawings. The present invention is not limited to the embodiment.

First Embodiment

Figure 1:
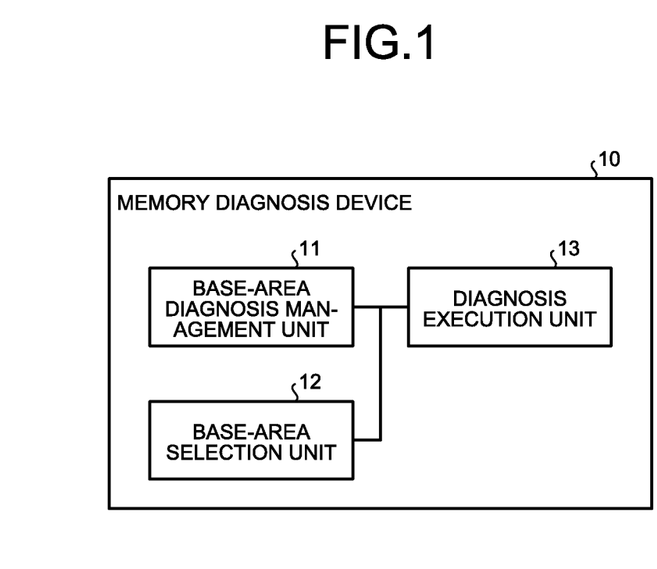
FIG. 1 is a diagram illustrating a functional configuration of a memory diagnosis apparatus according to a first embodiment.

FIG. 1 is a diagram illustrating a functional configuration of a memory diagnosis apparatus according to a first embodiment of the present invention. A memory diagnosis apparatus 10 includes a base-area diagnosis management unit 11. The base-area diagnosis management unit 11 receives from a diagnosis execution unit 13 described later a notification that a memory diagnosis on any of the divided memory areas has been completed, manages whether a memory diagnosis has been already carried out on each of the divided memory areas, and replies to the diagnosis execution unit 13 regarding whether a memory diagnosis has been already carried out on an area about which the diagnosis execution unit 13 has inquired. The memory diagnosis apparatus 10 further includes a base-area selection unit 12. The base-area selection unit 12 selects base areas and informs the diagnosis execution unit 13 of the selected base areas. The base area is a part of plural areas into which the memory has been divided, and is a basic unit area on which the memory diagnosis is carried out. The memory diagnosis apparatus 10 further includes the diagnosis execution unit 13. The diagnosis execution unit 13 inquires of the base-area diagnosis management unit 11 whether base areas informed from the base-area selection unit 12 has been already diagnosed, and performs a memory diagnosis by carrying out reading tests and writing tests on the base areas informed from the base-area selection unit 12. The diagnosis execution unit 13 performs a reading test and a writing test on each cell within the base area.

Figure 2:
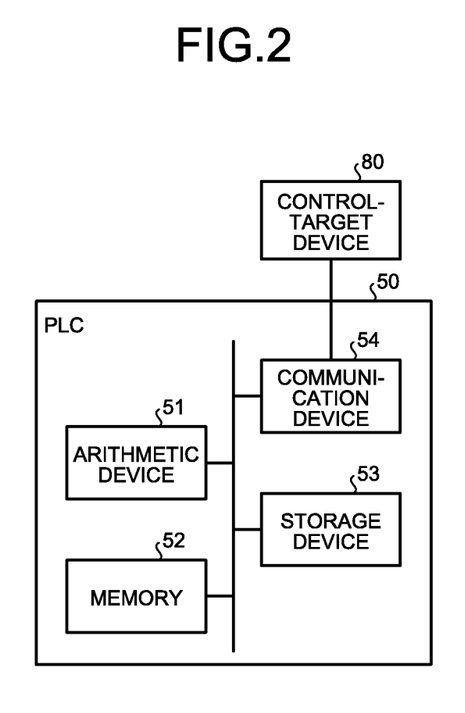
FIG. 2 is a diagram illustrating a hardware configuration of a programmable logic controller that implements the memory diagnosis apparatus according to the first embodiment.

FIG. 2 is a diagram illustrating a hardware configuration of a programmable logic controller that implements the memory diagnosis apparatus according to the first embodiment. The programmable logic controller is hereinafter represented as "PLC". A PLC 50 is a device that controls a control-target device 80. The PLC 50 includes an arithmetic device 51 that is a processing circuit that performs software processing by executing a memory diagnosis program, a memory 52 that is used as a working area by the arithmetic device 51, a storage device 53 that stores therein information, and a communication device 54 that communicates with the control-target device 80. As the arithmetic device 51, a central processing unit (CPU), or a system large scale integration (system LSI) can be used. As the memory 52, a random access memory (RAM) can be used. As the storage device 53, a hard disc drive or a solid state drive can be used.

Figure 3:
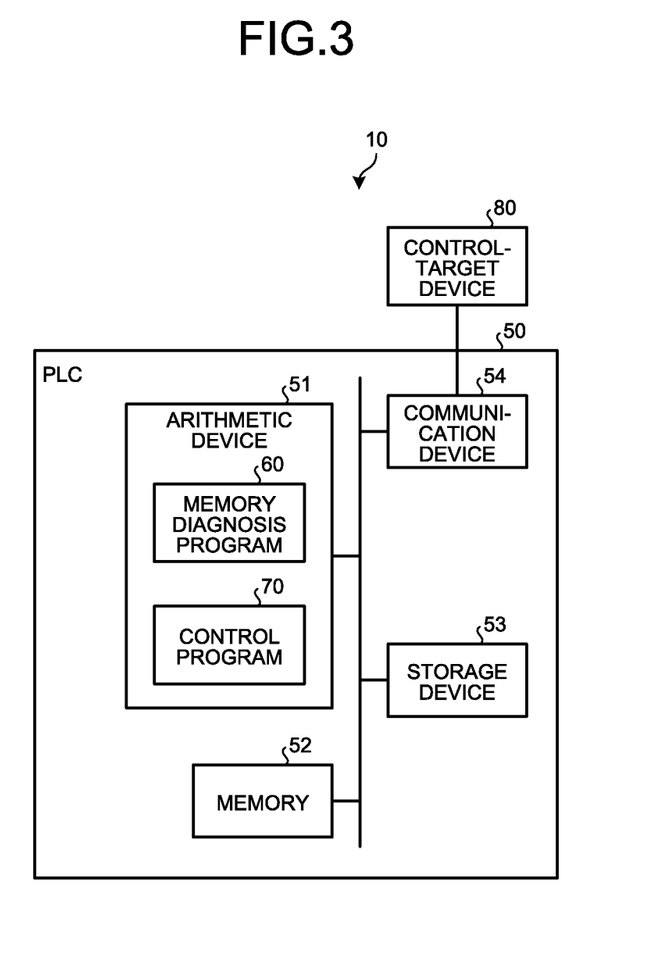
FIG. 3 is a diagram illustrating a configuration of the memory diagnosis apparatus according to the first embodiment.

FIG. 3 is a diagram illustrating a configuration of the memory diagnosis apparatus according to the first embodiment. The memory diagnosis apparatus 10 is implemented by the PLC 50 executing a memory diagnosis program and performing software processing. That is, when the PLC is executing an installed memory diagnosis program 60 by the arithmetic device 51, the PLC is the memory diagnosis apparatus 10. The base-area diagnosis management unit 11, the base-area selection unit 12, and the diagnosis execution unit 13 are implemented by the arithmetic device 51 that is a processing circuit that executes the memory diagnosis program 60 stored in the storage device 53. A plurality of processing circuits may cooperate with each other to implement the above functions.

The memory diagnosis program 60 is executed in the background of a control program 70 to be executed by the PLC 50 in order to control the control-target device 80. That is, while executing the control program 70 to control the control-target device 80, the arithmetic device 51 executes the memory diagnosis program 60 to carry out a memory diagnosis on the memory 52.

The memory diagnosis apparatus 10 according to the first embodiment divides the memory 52 to be diagnosed, into a plurality of areas, selects two or more areas as diagnostic targets from among the areas, and carries out a commonly-known memory diagnosis on the selected areas. Of the plural areas into which the memory 52 is divided, an area which is a diagnostic target is referred to as "base area" in the following descriptions. The memory diagnosis apparatus 10 changes a combination of the areas that are the base areas, to repeatedly carry out the memory diagnosis thereon, and defines all the combinations of the areas as base areas. In the manner as described above, the memory diagnosis apparatus 10 detects a coupling fault between the cells in all the combinations within the memory 52.

In carrying out the memory diagnosis on the base area on which the memory diagnosis has already been carried out, the diagnosis execution unit 13 omits the reading test on this base area. The diagnostic procedure that is capable of detecting a stuck-at fault and a coupling fault has been already determined as disclosed in Non Patent Literature 1. Even when the diagnosis execution unit 13 omits the reading test on the area on which the memory diagnosis has been already carried out, the procedure necessary to be capable of detecting a stuck-at fault and a coupling fault for all the cells is still satisfied. Since the diagnosis execution unit 13 omits the reading test on the area on which the memory diagnosis has been already carried out, the memory diagnosis apparatus 10 can complete the memory diagnosis that is capable of detecting a coupling fault in a shorter time as compared to the case where the reading test is not omitted.

The following description is made as to the operation of the memory diagnosis apparatus where two of the areas into which the memory is divided are selected as base areas. However, as described later, three or more areas may be selected as base areas from among the areas into which the memory is divided.

Figure 4:
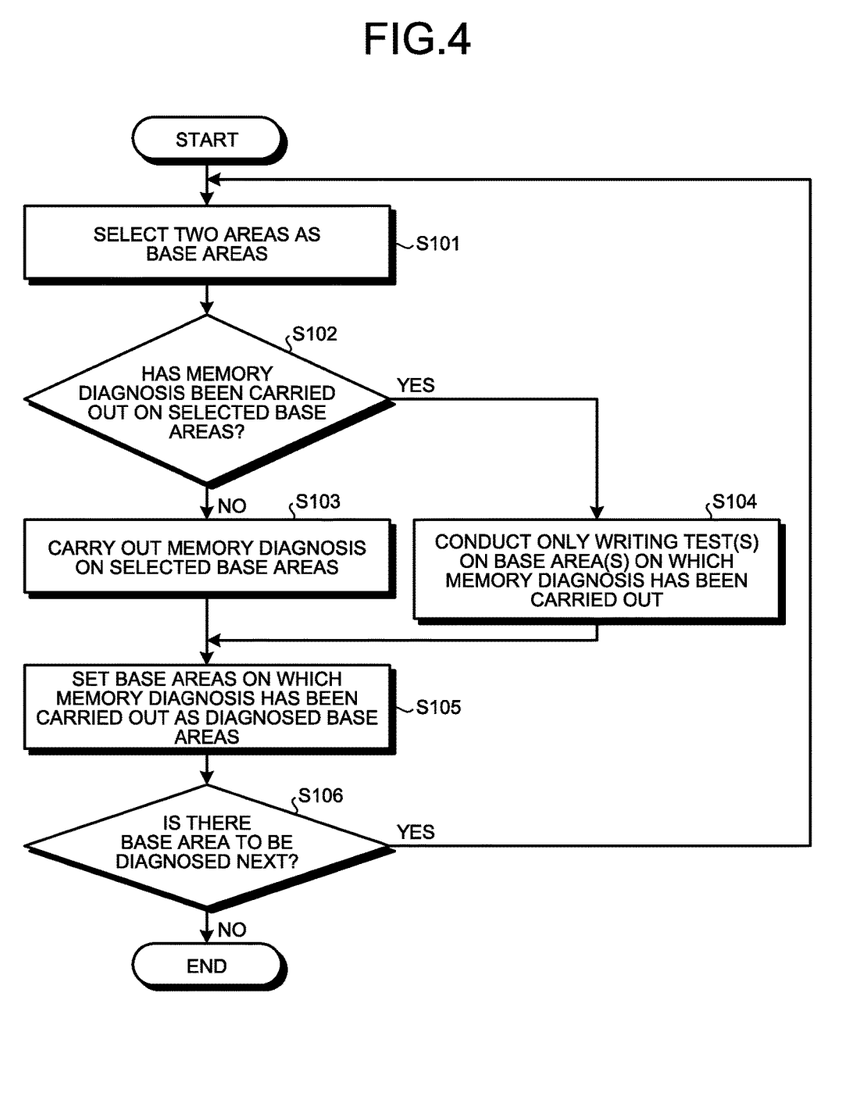
FIG. 4 is a flowchart illustrating an operation of the memory diagnosis apparatus according to the first embodiment.

FIG. 4 is a flowchart illustrating an operation of the memory diagnosis apparatus according to the first embodiment. At Step S101, the memory diagnosis apparatus 10 selects two areas as base areas that are diagnostic targets from among the areas into which the memory is divided. Specifically, the diagnosis execution unit 13 inquires of the base-area selection unit 12 about base areas that are targets for the memory diagnosis. The base-area selection unit 12 selects base areas as diagnostic targets, and informs the diagnosis execution unit 13 of these selected base areas. The order of selecting different base areas within the memory is not limited to a particular order. Any order can be employed as long as all the combinations of the areas into which the memory 52 is divided are eventually selected.

At Step S102, the memory diagnosis apparatus 10 determines whether the memory diagnosis has been carried out on the selected base areas. Specifically, the diagnosis execution unit 13 inquires of the base-area diagnosis management unit 11 whether the memory diagnosis has been already carried out on the base areas informed from the base-area selection unit 12, in order to confirm whether the selected base areas have been already diagnosed.

When the memory diagnosis has not been previously carried out on the base areas selected by the base-area selection unit 12, the reply to the inquiry at Step S102 is "NO". At Step S103, on the basis of the reply from the base-area diagnosis management unit 11, the diagnosis execution unit 13 carries out the memory diagnosis on the base areas selected by the base-area selection unit 12. The memory diagnosis in this example is a common memory diagnosis that carries out a reading diagnosis and a writing diagnosis. When Step S103 is finished, the process proceeds to Step S105.

When the memory diagnosis has been previously carried out on the base areas selected by the base-area selection unit 12, the reply to the inquiry at Step S102 is "YES". At Step S104, on the basis of the reply from the base-area diagnosis management unit 11, the diagnosis execution unit 13 performs only writing tests on the base areas on which the memory diagnosis has been previously carried out. When Step S104 is finished, the process proceeds to Step S105.

At Step S105, the memory diagnosis apparatus 10 sets the base areas on which the memory diagnosis has been carried out, as the diagnosed base areas. Specifically, after the memory diagnosis on the base areas has been completed, the diagnosis execution unit 13 informs the base-area diagnosis management unit 11 of the base areas on which the memory diagnosis has been finished. The base-area diagnosis management unit 11 memorizes the completion of the diagnosis on the base areas informed from the diagnosis execution unit 13.

At Step S106, the memory diagnosis apparatus 10 determines whether there is an area that should be diagnosed next. Specifically, the diagnosis execution unit 13 inquires of the base-area diagnosis management unit 11 about an area that should be diagnosed next among the areas into which the memory 52 is divided. When the base area that should be diagnosed next is not conveyed from the base-area diagnosis management unit 11, the diagnosis execution unit 13 determines that the memory diagnosis has been already carried out on all the combinations of the areas into which the memory 52 is divided, and therefore there is no base area that should be diagnosed next (NO at Step S106), and then finishes the memory diagnosis. When the base area that should be diagnosed next is conveyed from the base-area diagnosis management unit 11, the diagnosis execution unit 13 determines that there is a base area that should be diagnosed next (YES at Step S106), and then the process returns to Step S101.

Figure 5:
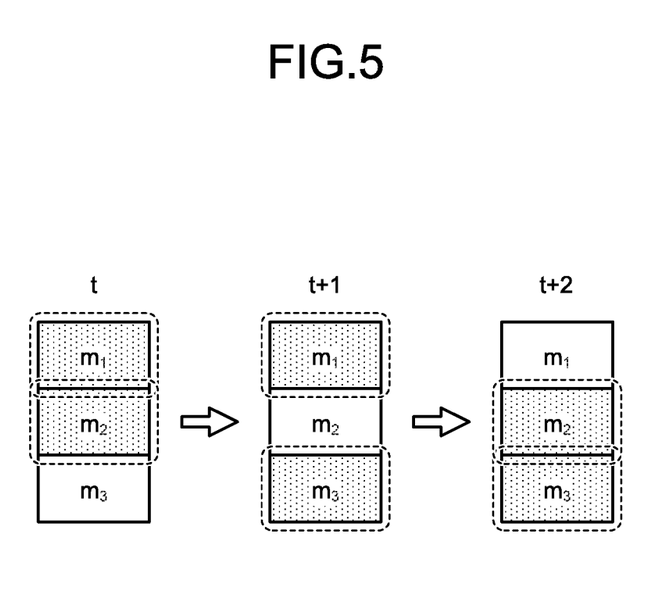
FIG. 5 is a schematic diagram illustrating an example of an operation of the memory diagnosis apparatus according to the first embodiment.

FIG. 5 is a schematic diagram illustrating an example of an operation of the memory diagnosis apparatus according to the first embodiment. In this example, the memory 52 is divided into three areas $m_1$, $m_2$, and $m_3$. In FIG. 5, the areas surrounded by the dotted line are base areas.

The memory diagnosis apparatus 10 carries out the commonly-known memory diagnosis on the areas $m_1$ and $m_2$ selected as the base areas in a cycle "t". The memory diagnosis apparatus 10 carries out the commonly-known memory diagnosis on the areas $m_1$ and $m_3$ selected as the base areas in a cycle "t+1". The memory diagnosis apparatus 10 carries out the commonly-known memory diagnosis on the areas $m_2$ and $m_3$ selected as the base areas in a cycle "t+2". The commonly-known memory diagnosis in this example is a memory diagnosis that detects a memory fault by performing the reading test and the writing test on a cell of the memory 52, and determining whether the test results match the expected values. Examples of the commonly-known memory diagnosis include "Abraham" and "March". These commonly-known memory diagnoses show the diagnosis method of using various algorithms that process different combinations of cells in different orders, in accordance with the diagnostic processing time and the diagnostic rate, to execute the process of "writing and reading a value to and from a cell of the memory, and confirming whether the read value matches the written value".

The diagnosis execution unit 13 performs the reading tests and writing tests on the areas $m_1$ and $m_2$ that are the base areas in the cycle "t" because there are no areas on which the memory diagnosis has been carried out.

The diagnosis execution unit 13 omits the reading test on the area $m_1$ and performs only the writing test on the area $m_1$ in the cycle "t+1" because the diagnosis execution unit 13 has already carried out the memory diagnosis on the area $m_1$ in the cycle "t". Meanwhile, the diagnosis execution unit 13 performs the reading test and the writing test on the area $m_3$ that is the base area.

The diagnosis execution unit 13 omits the reading tests on the areas $m_2$ and $m_3$ and only performs the writing tests on the areas $m_2$ and $m_3$ in the cycle "t+2" because the diagnosis execution unit 13 has already carried out the memory diagnosis on the area $m_2$ in the cycle "t" and on the area $m_3$ in the cycle "t+1".

Figure 6:
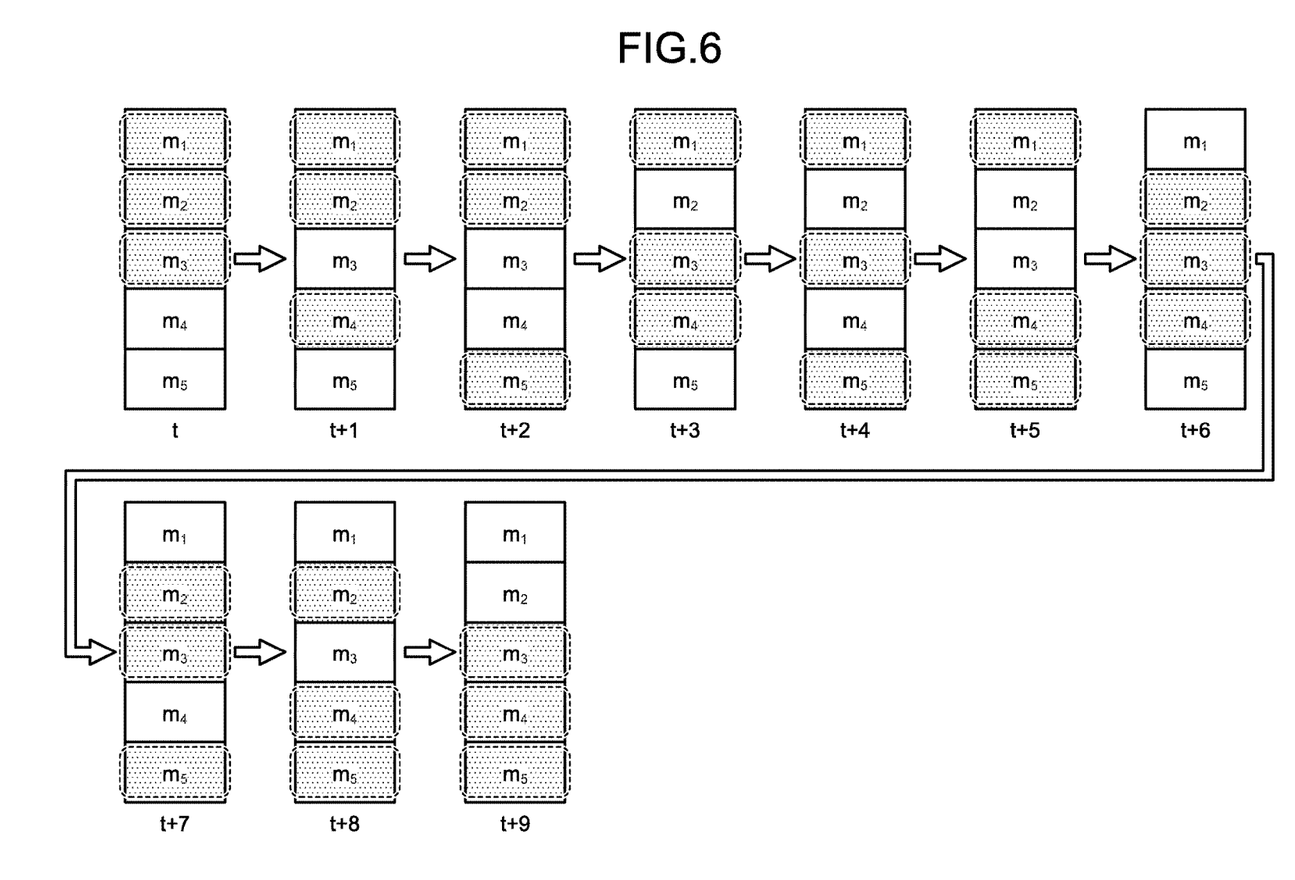
FIG. 6 is a schematic diagram illustrating another example of the operation of the memory diagnosis apparatus according to the first embodiment.

FIG. 6 is a schematic diagram illustrating another example of the operation of the memory diagnosis apparatus according to the first embodiment. In this example, the memory 52 is divided into five areas from $m_1$ to $m_5$. Further, in this example, the memory diagnosis apparatus 10 selects three of the areas as base areas. In FIG. 6, the areas surrounded by the dotted line are the base areas.

The memory diagnosis apparatus 10 carries out the commonly-known memory diagnosis on the areas $m_1$, $m_2$, and $m_3$ as the base areas in the cycle "t". The memory diagnosis apparatus 10 carries out the commonly-known memory diagnosis on the areas $m_1$, $m_2$, and $m_4$ as the base areas in the cycle "t+1". The memory diagnosis apparatus 10 carries out the commonly-known memory diagnosis on the areas $m_1$, $m_2$, and $m_5$ as the base areas in the cycle "t+2". The memory diagnosis apparatus 10 carries out the commonly-known memory diagnosis on the areas $m_1$, $m_3$, and $m_4$ as the base areas in a cycle "t+3". The memory diagnosis apparatus 10 carries out the commonly-known memory diagnosis on the areas $m_1$, $m_3$, and $m_5$ as the base areas in a cycle "t+4". The memory diagnosis apparatus 10 carries out the commonly-known memory diagnosis on the areas $m_1$, $m_4$, and $m_5$ as the base areas in a cycle "t+5". The memory diagnosis apparatus 10 carries out the commonly-known memory diagnosis on the areas $m_2$, $m_3$, and $m_4$ as the base areas in a cycle "t+6". The memory diagnosis apparatus 10 carries out the commonly-known memory diagnosis on the areas $m_2$, $m_3$, and $m_5$ as the base areas in a cycle "t+7". The memory diagnosis apparatus 10 carries out the commonly-known memory diagnosis on the areas $m_2$, $m_4$, and $m_5$ as the base areas in a cycle "t+8". The memory diagnosis apparatus 10 carries out the commonly-known memory diagnosis on the areas $m_3$, $m_4$, and $m_5$ as the base areas in a cycle "t+9".

The diagnosis execution unit 13 performs the reading tests and the writing tests on the areas $m_1$, $m_2$, and $m_3$ that are the base areas in the cycle "t" because there are no areas on which the memory diagnosis has been carried out.

The diagnosis execution unit 13 omits the reading tests on the areas $m_1$ and $m_2$ and performs only the writing tests on these areas in the cycle "t+1", because the diagnosis execution unit 13 has already carried out the memory diagnosis on the areas $m_1$ and $m_2$ in the cycle "t".

The diagnosis execution unit 13 omits the reading tests on the areas $m_1$ and $m_2$ and performs only the writing tests on these areas in the cycle "t+2", because the diagnosis execution unit 13 has already carried out the memory diagnosis on the areas $m_1$ and $m_2$ in the cycle "t".

The diagnosis execution unit 13 omits the reading tests on the areas $m_1$, $m_3$, and $m_4$, and performs only the writing tests on these areas in the cycle "t+3", because the diagnosis execution unit 13 has already carried out the memory diagnosis on the areas $m_1$ and $m_3$ in the cycle "t", and on the area $m_4$ in the cycle "t+1".

The diagnosis execution unit 13 omits the reading tests on the areas $m_1$, $m_3$, and $m_5$ and performs only the writing tests on these areas in the cycle "t+4", because the diagnosis execution unit 13 has already carried out the memory diagnosis on the areas $m_1$ and $m_3$ in the cycle "t", and on the area $m_5$ in the cycle "t+2".

The diagnosis execution unit 13 omits the reading tests on the areas $m_1$, $m_4$, and $m_5$, and performs only the writing tests on these areas in the cycle "t+5", because the diagnosis execution unit 13 has already carried out the memory diagnosis on the area m1 in the cycle "t", on the area $m_4$ in the cycle "t+1", and on the area $m_5$ in the cycle "t+2".

The diagnosis execution unit 13 omits the reading tests on the areas $m_2$, $m_3$, and $m_4$, and performs only the writing tests on these areas in the cycle "t+6", because the diagnosis execution unit 13 has already carried out the memory diagnosis on the areas $m_2$ and $m_3$ in the cycle "t", and on the area $m_4$ in the cycle "t+1".

The diagnosis execution unit 13 omits the reading tests on the areas $m_2$, $m_3$, and $m_5$, and performs only the writing tests on these areas in the cycle "t+7", because the diagnosis execution unit 13 has already carried out the memory diagnosis on the areas $m_2$ and $m_3$ in the cycle "t", and on the area $m_5$ in the cycle "t+2".

The diagnosis execution unit 13 omits the reading tests on the areas $m_2$, $m_4$, and $m_5$, and performs only the writing tests on these areas in the cycle "t+8", because the diagnosis execution unit 13 has already carried out the memory diagnosis on the area $m_2$ in the cycle "t", on the area $m_4$ in the cycle "t+1", and on the area $m_5$ in the cycle "t+2".

The diagnosis execution unit 13 omits the reading tests on the areas $m_3$, $m_4$, and $m_5$, and performs only the writing tests on these areas in the cycle "t+9", because the diagnosis execution unit 13 has already carried out the memory diagnosis on the area $m_3$ in the cycle "t", on the area $m_4$ in the cycle "t+1", and on the area $m_5$ in the cycle "t+2".

When carrying out the memory diagnosis on the base area that is the area on which the reading test has been already performed, the memory diagnosis apparatus 10 according to the first embodiment omits the reading test on this base area on which the reading test has been already performed, thereby eliminating the redundant process. This enables the memory diagnosis apparatus 10 according to the first embodiment to reduce the processing time without decreasing the diagnostic rate.

The above descriptions have been made as to the the example in which the arithmetic device 51 in the PLC 50 executes the memory diagnosis program 60 in the background of the control program 70 to carry out the memory diagnosis on the memory 52. However, an external computer can be connected to the PLC 50 to cause the computer to execute the memory diagnosis program so as to carry out the memory diagnosis. The processing load on the arithmetic device 51 in the PLC 50 can be reduced by causing the external computer connected to the PLC 50 to execute the memory diagnosis program so as to carry out the memory diagnosis. This makes it possible for the PLC 50 to more accurately perform a control operation on the control-target device 80.

The configuration described in the above embodiment is only an example of the contents of the present invention. The configuration can be combined with other well-known techniques, and a part of the configuration can be omitted or changed without departing from the scope of the invention.

REFERENCE SIGNS LIST

10 memory diagnosis apparatus
11 base-area diagnosis management unit
12 base-area selection unit
13 diagnosis execution unit
50 PLC
51 arithmetic device
52 memory
53 storage device
60 memory diagnosis program
70 control program
80 control-target device

The invention claimed is:

1. A memory diagnosis apparatus to diagnose whether a fault occurs in a memory, the memory diagnosis apparatus comprising:
a processor configured to:
divide the memory into a plurality of areas,
select two or more base areas as diagnostic targets from among the areas to perform a memory diagnosis that includes a reading test and a writing test,
determine whether the memory diagnosis that includes the reading test and the writing test has been carried out on each of the selected base areas, and
perform a memory diagnosis that includes: (i) for each of the selected base areas that the reading test and the writing test have not been previously performed on, performing the memory diagnosis that includes the reading test and the writing test on the selected base area, and (ii) for each of the selected base areas that the reading test and the writing test has been previously performed on, performing only the writing test without performing the reading test.

2. The memory diagnosis apparatus according to claim 1, wherein the processor is further configured to:
receive a notification that the memory diagnosis on the base areas has been completed,
manage whether a memory diagnosis has been carried out on each of the areas into which the memory is divided,
reply regarding whether a memory diagnosis has been already carried out on an area inquired about,
select base areas that are areas on which the memory diagnosis is to be carried out, and
inform of the selected base areas.

3. A non-transitory computer-readable medium storing a memory diagnosis program that, when executed by a programmable logic controller, causes the programmable logic controller to perform a process of diagnosing whether a fault occurs in a memory, wherein the memory diagnosis program causes the programmable logic controller to:
divide the memory into a plurality of areas,
select two or more base areas as diagnostic targets from among the areas to perform a memory diagnosis that includes a reading test and a writing test,
determine whether the memory diagnosis that includes the reading test and the writing test has been carried out on each of the selected base areas, and
perform a memory diagnosis that includes: (i) for each of the selected base areas that the reading test and the writing test have not been previously performed on, performing the memory diagnosis that includes the reading test and the writing test on the selected base area, and (ii) for each of the selected base areas that the reading test and the writing test have been previously performed on, performing only the writing test without performing the reading test.

4. The memory diagnosis program non-transitory computer-readable medium according to claim 3, wherein the memory diagnosis program causes the programmable logic controller to:
receive a notification that the memory diagnosis on the base areas has been completed,
manage whether a memory diagnosis has been carried out on each of the areas into which the memory is divided,
reply regarding whether a memory diagnosis has been already carried out on an area inquired about,
select base areas that are areas on which the memory diagnosis is to be carried out, and
inform of the selected base areas.

5. The memory diagnosis apparatus according to claim 1, wherein the memory diagnosis that includes the reading test and the writing test is a memory diagnosis that detects a memory fault by performing the reading test and the writing test on a cell of the memory, and determines whether the test results match the expected values.

6. The memory diagnosis apparatus according to claim 5, wherein the memory diagnosis that includes the reading test and the writing test is one of an "Abraham" memory diagnosis or a "March" memory diagnosis.

7. The memory diagnosis apparatus according to claim 1, wherein the memory diagnosis that includes the reading test and the writing test uses an algorithm that processes different combinations of cells in different orders, in accordance with a diagnostic processing time and a diagnostic rate, to execute a process of writing and reading a value to and from a cell of the memory, and confirming whether the read value matches the written value.

\* \* \* \* \*